(12) United States Patent
Kagoshima et al.

(10) Patent No.: US 12,255,243 B2
(45) Date of Patent: Mar. 18, 2025

(54) METHOD FOR MANUFACTURING SWITCHING DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Eiji Kagoshima, Nisshin (JP); Yohei Iwahashi, Nisshin (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 425 days.

(21) Appl. No.: 17/716,213

(22) Filed: Apr. 8, 2022

(65) Prior Publication Data

US 2022/0336603 A1    Oct. 20, 2022

(30) Foreign Application Priority Data

Apr. 14, 2021    (JP) .................................. 2021-068593

(51) Int. Cl.
*H01L 29/423*   (2006.01)
*H01L 29/10*    (2006.01)
*H01L 29/66*    (2006.01)
*H01L 29/78*    (2006.01)

(52) U.S. Cl.
CPC ...... *H01L 29/4236* (2013.01); *H01L 29/1095* (2013.01); *H01L 29/42364* (2013.01); *H01L 29/66727* (2013.01); *H01L 29/7813* (2013.01)

(58) Field of Classification Search
CPC ............. H01L 29/4236; H01L 29/1095; H01L 29/42364; H01L 29/6627; H01L 29/7818
See application file for complete search history.

(56) References Cited

U.S. PATENT DOCUMENTS

| | | | |
|---|---|---|---|
| 2004/0166619 A1* | 8/2004 | Takemori | H01L 29/41741 438/197 |
| 2005/0167748 A1 | 8/2005 | Onda et al. | |
| 2008/0073709 A1* | 3/2008 | Fujimoto | H10B 12/053 257/E21.429 |
| 2022/0190118 A1* | 6/2022 | Asaba | H01L 29/4238 |

FOREIGN PATENT DOCUMENTS

| | | | |
|---|---|---|---|
| JP | 2020096084 A | 6/2020 | |
| JP | 2020-207693 | * 12/2020 | |

* cited by examiner

*Primary Examiner* — Timor Karimy
(74) *Attorney, Agent, or Firm* — Posz Law Group, PLC

(57) ABSTRACT

A method for manufacturing a switching device includes: forming a trench at a top surface of a semiconductor substrate; forming a gate insulation film for covering an inner surface of the trench; forming a gate electrode inside the trench to locate a top surface of the gate electrode below the top surface of the semiconductor substrate; forming an oxide film by oxidizing the top surface of the gate electrode; forming an interlayer insulation film by vapor phase growth at a top surface of the oxide film to locate a top surface of the interlayer insulation film below the top surface of the semiconductor substrate; and forming an upper electrode in contact with the semiconductor substrate at the top surface of the semiconductor substrate and a side surface of the trench located above the top surface of the interlayer insulation film.

4 Claims, 14 Drawing Sheets

METHOD FOR MANUFACTURING SWITCHING DEVICE

CROSS REFERENCE TO RELATED APPLICATIONS

This application is based on Japanese Patent Application No. 2021-068593 filed on Apr. 14, 2021, the disclosure of which is incorporated herein by reference.

TECHNICAL FIELD

The present disclosure relates to a method for manufacturing a switching device.

BACKGROUND

A switching device may include a semiconductor substrate, a trench, a gate insulation film, a gate electrode and an interlayer insulation film. The trench may be disposed at a top surface of the semiconductor substrate. The gate insulation film may cover an inner surface of the trench. The interlayer insulation film may cover a top surface of the gate electrode.

SUMMARY

The present disclosure describes a method for manufacturing a switching device including formation of a trench, a gate insulation film, a gate electrode and an interlayer insulation film.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
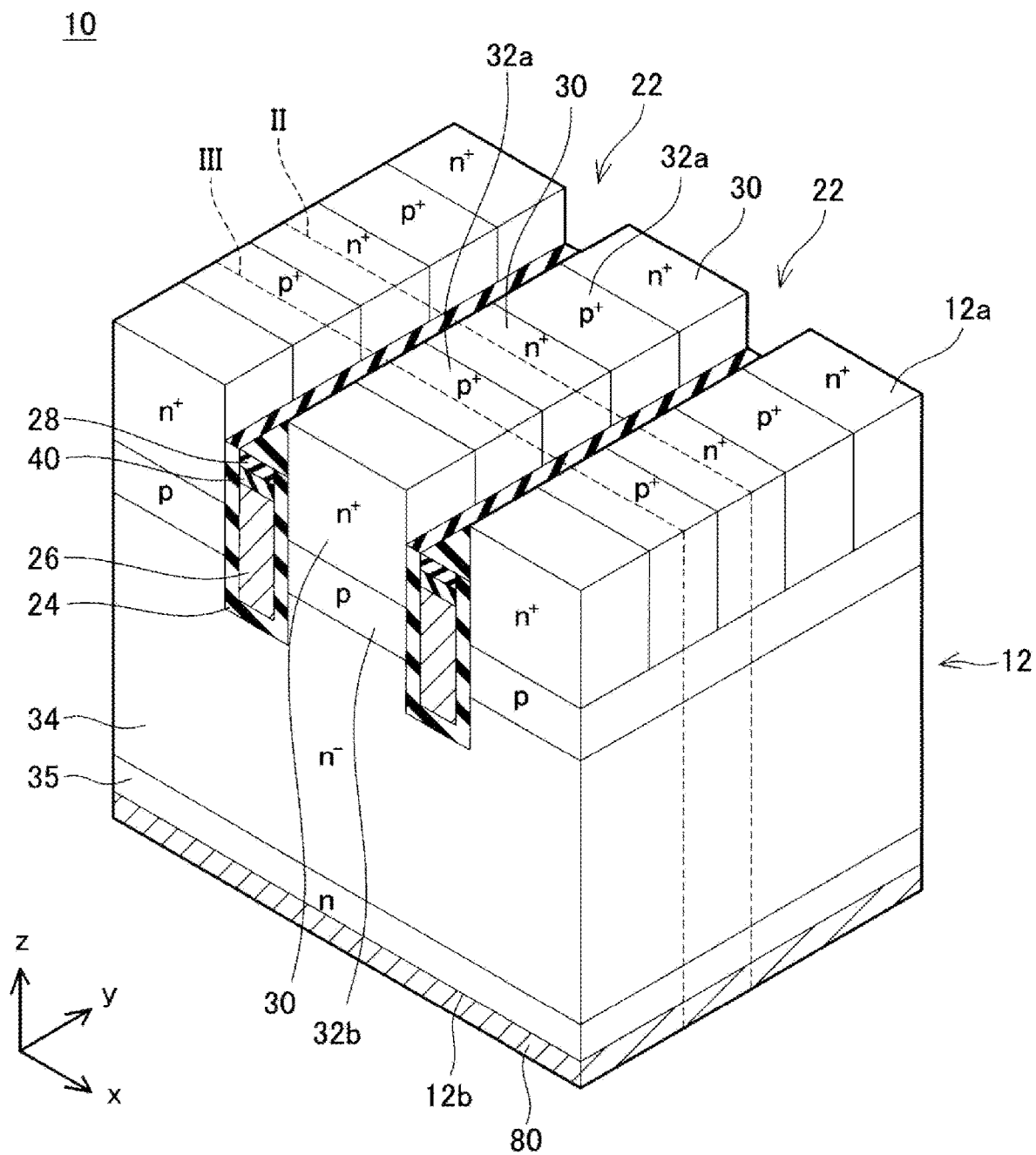
FIG. 1 is a perspective view of a switching device according to a first embodiment.

In a method of manufacturing a switching device, a gate electrode may be formed such that a top surface of the gate electrode is located below a top surface of a semiconductor substrate, after a gate insulation film is formed at the inner surface of a trench. Subsequently, an insulation layer may be deposited inside the trench and at the top surface of the semiconductor substrate with chemical vapor deposition (CVD) technique. Subsequently, the insulation layer may be etched to form an interlayer insulation film embedded inside the trench.

However, in the manufacturing method described above, it may be required to form a thicker interlayer insulation film to ensure a withstand voltage of the interlayer insulation film.

According to an aspect of the present disclosure, a method for manufacturing a switching device including: forming a trench at a top surface of a semiconductor substrate; forming a gate insulation film for covering an inner surface of the trench; forming a gate electrode inside the trench to locate a top surface of the gate electrode below the top surface of the semiconductor substrate; forming an oxide film by oxidizing the top surface of the gate electrode; forming an interlayer insulation film by vapor phase growth at a top surface of the oxide film to locate a top surface of the interlayer insulation film below the top surface of the semiconductor substrate; and forming an upper electrode in contact with the semiconductor substrate at the top surface of the semiconductor substrate and a side surface of the trench located above the top surface of the interlayer insulation film.

In the process of forming the interlayer insulation film at the top surface of the oxide film through vapor phase growth, the top surface of the interlayer insulation film may be located below the top surface of the semiconductor substrate by adjusting the time of the vapor phase growth. In the process, the interlayer insulation film extending to the upper side of the top surface of the semiconductor substrate is formed through the vapor phase growth, and the top surface of the interlayer insulation film may be located below the top surface of the interlayer insulation film by etching the interlayer insulation film. The vapor phase growth described in the present disclosure may also be referred to as vapor phase epitaxial growth or vapor phase deposition.

In the manufacturing method described above, the oxide film is formed by oxidizing the gate electrode. As a result, the top surface of the gate electrode is covered by the oxide film. Subsequently, the double-layered insulation film for covering the gate electrode is formed by growing the interlayer insulation film at the top surface of the oxide film through vapor phase growth. The oxide film formed by oxidizing the gate electrode has lower content of impurities such as hydrogen and higher compactness, as compared with the interlayer insulation film formed by vapor phase growth. For this reason, the oxide film has a higher withstand voltage. Since the withstand voltage is ensured by the oxide film, it is possible to reduce the film thickness of the interlayer insulation film formed by subsequent vapor deposition. In the manufacturing method described above, it is possible to reduce the film thickness of the entire insulation film while ensuring the withstand voltage of the insulation film for covering the gate electrode. Therefore, it is possible to enlarge the contact area between the upper electrode and the side surface of the trench at the upper part of the interlayer insulation film.

The technical elements disclosed herein are listed below. The following technical elements are applicable independently.

In a manufacturing method as an example disclosed in the present embodiment, a semiconductor substrate may be made of silicon carbide. The semiconductor substrate may have an n-type drift region, a p-type body region arranged above the drift region, and an n-type source region arranged above the body region. A trench may penetrate the source region and the body region and reach the drift region in the formation of the trench. The top surface of the gate electrode may be oxidized to satisfy the mathematical relation of L>2.7×A, where "L" denotes the length between the oxide film and the body region along the side surface of the trench, and "A" denotes a diffusion distance of oxidized species diffusing into the gate insulation film at the time of oxidizing the gate electrode. In other words, "L" is greater than a value obtained by 2.7 multiplied by "A".

In the manufacturing method, it is difficult for the oxidized species, for example, oxygen at the time of oxidizing the gate electrode to reach the body region. When the gate electrode is oxidized, the body region (in other words, the region where the channel is formed) having a region in contact with the gate insulation film is less likely to be oxidized, and the interface between the body region and the gate insulation film is less likely to be defective. According to the manufacturing method, it is possible to manufacture the switching deice having a stable gate threshold value.

In the formation of the trench, a curved surface may be formed at a boundary portion between the side surface of the trench and the top surface of the semiconductor substrate.

In the manufacturing method, when a metal layer or the like is formed from the side surface of the trench over the upper surface of the semiconductor substrate, the film forming property enhances and the reliability of the manufactured switching device enhances.

First Embodiment

Figure 2:
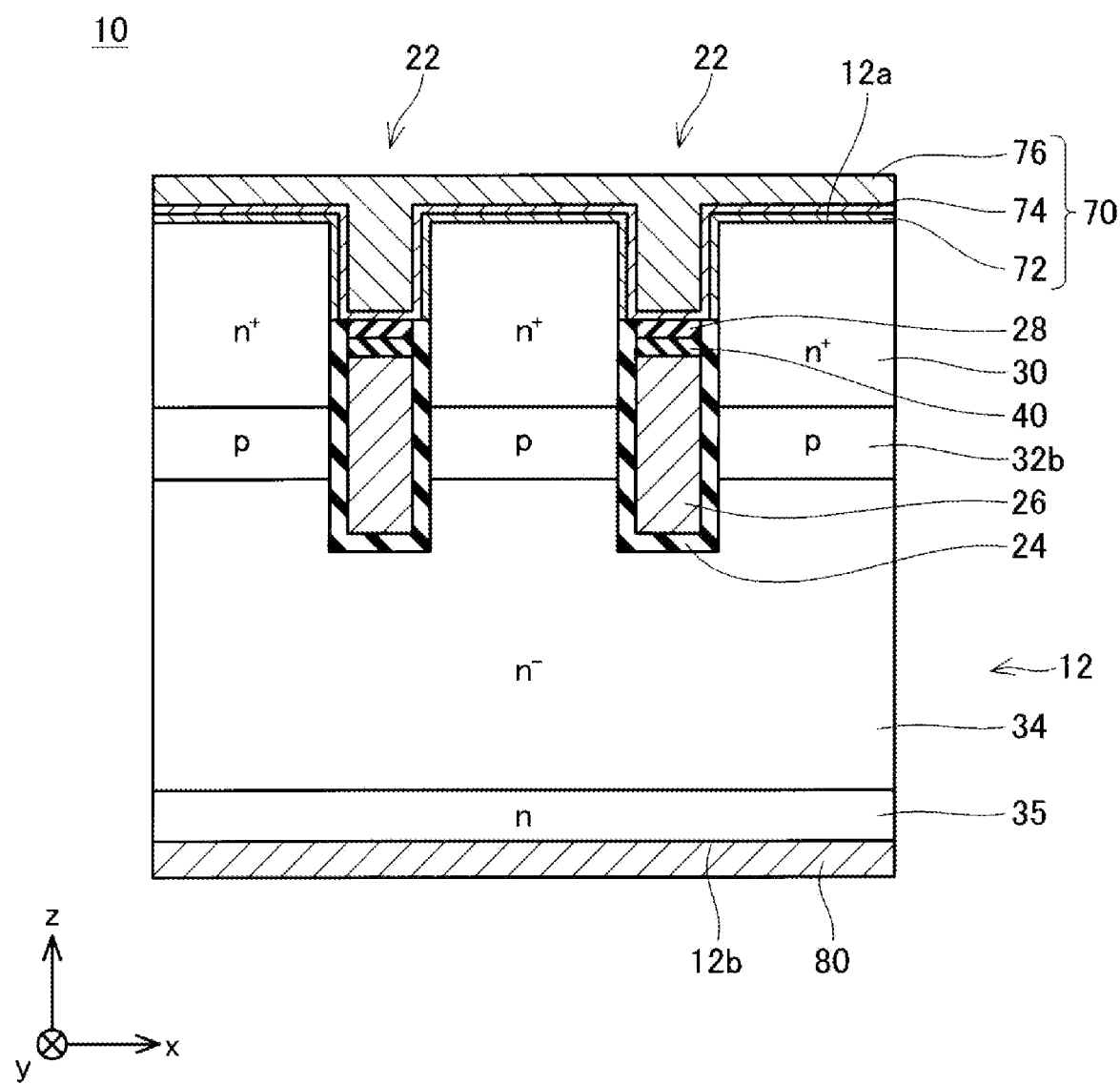
FIG. 2 is a cross-sectional view taken along a plane II in FIG. 1.
Figure 3:
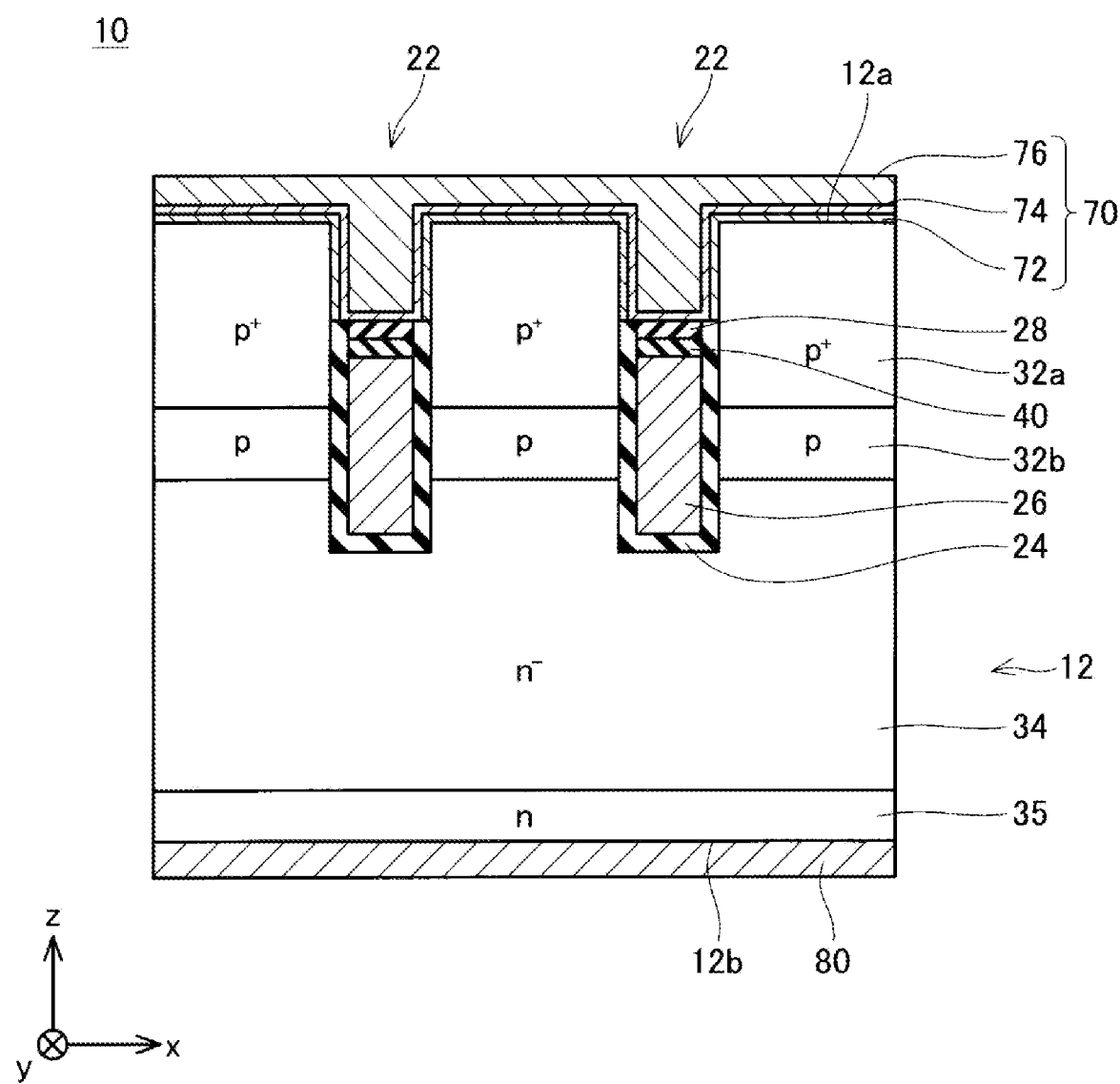
FIG. 3 is a cross-sectional view taken along a plane III in FIG. 1.

Each of FIGS. 1 to 3 illustrates a switching device 10 according to a first embodiment. The switching device 10 is a Metal-Oxide-Semiconductor Field-Effect Transistor (MOSFET). The switching device 10 described in the present disclosure may also be referred to as a switching element. The switching device 10 includes a semiconductor substrate 12. The semiconductor substrate 12 is made of silicon carbide (SiC). However, the material made for the semiconductor substrate 12 is not particularly limited, and may be, for example, other semiconductor material such as silicon (Si) or gallium nitride (GaN). In the following, a direction parallel to a top surface 12a of the semiconductor substrate 12 may also be referred to as an x-direction, a direction parallel to the top surface 12a and perpendicular to the x-direction may also be referred to as an y-direction, and a thickness direction of the semiconductor substrate 12 may also be referred to as a z-direction. FIG. 2 is a cross-sectional view taken along a line II-II in FIG. 1, and FIG. 3 is a cross-sectional view taken along a line III-III in FIG. 1. As illustrated in FIGS. 2 and 3, a source electrode 70 is disposed above the top surface 12a of the semiconductor substrate 12. FIG. 1 omits the illustration of the source electrode 70.

Multiple trenches 22 are disposed at the top surface 12a of the semiconductor substrate 12. As illustrated in FIG. 1, the trenches 22 extend and are parallel to each other at the top surface 12a. Each of the trenches 22 extends linearly. The trenches 22 are arranged at intervals in the x-direction. The gate insulation film 24, the gate electrode 26, the oxide film 40 and the interlayer insulation film 28 are arranged inside of each of the trenches 22.

The gate insulation film 24 covers the inner surface of the trench 22. The top end of the gate insulation film 24 locates below the top surface 12a of the semiconductor substrate 12. In other words, the top end of the gate insulation film 24 locates inside the trench 22. The gate insulation film 24 is made of silicon oxide.

The gate electrode 26 is arranged inside the trench 22. The gate electrode 26 is insulated from the semiconductor substrate 12 by the gate insulation film 24. The gate electrode 26 is made of polysilicon.

The oxide film 40 covers the top surface of the gate electrode 26. The oxide film 40 is made of silicon oxide. The oxide film 40 is formed by thermally oxidizing the gate electrode 26. The oxide film 40 has a relatively low hydrogen content.

The interlayer insulation film 28 covers the top surface of the oxide film 40. The interlayer insulation film 28 is made of silicon oxide. The interlayer insulation film 28 is formed by vapor phase growth of, for example, a silane compound at the top surface of the oxide film 40. The interlayer insulation film 28 has a higher hydrogen content than the oxide film 40.

A drain electrode 80 is arranged at a bottom surface 12b of the semiconductor substrate 12. The drain electrode 80 is in contact with substantially the entire bottom surface 12b of the semiconductor substrate 12.

As illustrated in FIGS. 2 and 3, a source electrode 70 is disposed at the top surface 12a of the semiconductor substrate 12. The source electrode 70 is arranged so as to straddle the inside of the trench 22 from a location above the top surface 12a. The source electrode 70 covers the top surface 12a of the semiconductor substrate 12, the side surface of the trench 22 above the interlayer insulation film 28, and the top surface of the interlayer insulation film 28. The source electrode 70 is insulated from the gate electrode 26 by the interlayer insulation film 28 and the oxide film 40. The source electrode 70 has a nickel silicide layer 72, a barrier metal layer 74, and an aluminum layer 76. The source electrode 70 is one of examples of an upper electrode.

The nickel silicide layer 72 extends from a location above the top surface 12a of the semiconductor substrate 12 to a location inside the trench 22. The nickel silicide layer 72 extends to a position adjacent to the gate insulation film 24 on the upper side and covers the side surface of the trench 22. The nickel silicide layer 72 is made of a compound of nickel and silicon.

The barrier metal layer 74 extends from a location above the nickel silicide layer 72 to a location inside the trench 22. The barrier metal layer 74 covers the surface of the nickel silicide layer 72 and the top surface of the interlayer insulation film 28. The barrier metal layer 74 is made of, for example, a metal containing titanium such as titanium alone or an alloy of titanium and aluminum.

The aluminum layer 76 extends from a location above the top surface 12a of the semiconductor substrate 12 to a location inside the trench 22. The aluminum layer 76 covers the surface of the barrier metal layer 74.

As illustrated in FIGS. 1 to 3, multiple source regions 30, body regions 32, drift regions 34 and drain regions 35 are disposed inside the semiconductor substrate 12.

Each of the source regions 30 is an n-type region. As illustrated in FIGS. 1 and 2, each of the source regions 30 is disposed in a region (hereinafter referred to as an inter-trench region) sandwiched between two adjacent trenches 22. As illustrated in FIG. 1, the source regions 30 are respectively arranged at intervals in the y-direction at the inter-trench regions. As illustrated in FIG. 2, each of the source regions 30 is arranged at a region exposed to the top surface 12a of the semiconductor substrate 12, and is in ohmic contact with the source region 70. Each of the source region 30 is in ohmic contact with the nickel silicide layer 72. Each of the source regions 30 is in contact with the gate insulation film 24 below the nickel silicide layer 72.

The body region 32 is a p-type region. As illustrated in FIGS. 1 and 3, the body region 32 has multiple contact regions 32a and a main body region 32b.

Each of the contact regions 32a is a p-type region with higher impurity concentration. As illustrated in FIGS. 1 and 3, each of the contact regions 32a is arranged in the inter-trench region. Each of the contact regions 32a is arranged in a region exposed to the top surface 12a of the semiconductor substrate 12. As illustrated in FIG. 1, in each of the inter-trench regions, the contact regions 32a are arranged at intervals in the y-direction. The source region 30 and the contact region 32a are alternately arranged in the y-direction. As illustrated in FIG. 3, each of the contact regions 32a is in ohmic contact with the source electrode 70. Each of the contact regions 32a is in ohmic contact with the nickel silicide layer 72. Each of the contact regions 32a is in contact with the gate insulation film 24 below the nickel silicide layer 72.

The main body region 32b is a p-type region having lower p-type impurity concentration than each of the contact regions 32a. As illustrated in FIGS. 1 to 3, the main body region 32b is arranged below each of the source regions 30 and each of the contact regions 32a. The main body region 32b is in contact with each of the source regions 30 and each of the contact regions 32a below. The main body region 32b is distributed over the entire lower region of each of the source regions 30 and each of the contact regions 32a. As illustrated in FIGS. 2 and 3, the main body region 32b is in contact with the gate insulation film 24 below each of the source regions 30 and each of the contact regions 32a. The lower end of the main body region 32b is arranged above the lower end of the gate electrode 26.

A drift region 34 is an n-type region. As illustrated in FIGS. 1 to 3, the drift region 34 is arranged below the main body region 32b. The drift region 34 is in contact with the lower body region 32 as viewed from below. The drift region 34 is separated from each of the source regions 30 by the main body region 32b. The drift region 34 is distributed from each of the inter-trench regions to a region below each of the trenches 22. The drift region 34 is in contact with the gate insulation film 24 below the main body region 32b. The drift region 34 is in contact with the gate insulation film 24 at the bottom surface of the trench 22.

The drain region 35 is an n-type region with higher n-type impurity concentration than the drift region 34. As illustrated in FIGS. 1 to 3, the drain region 35 is arranged below the drift region 34. The drain region 35 is in contact with the drift region 34 as viewed from below. The drain region 35 is exposed to the bottom surface 12b of the semiconductor substrate 12. The drain region 35 is in ohmic contact with the drain electrode 80.

The following describes the operation of the switching device 10. When the switching device 10 is used, the switching device 10, a power supply and a load such as a motor are connected in series. A power supply voltage is applied to the series circuit of the switching device 10 and the load. The power supply voltage is applied in a direction in which the drain electrode 80 has a higher potential than the source electrode 70. When an on-potential is applied to the gate electrode 26, a channel is formed at the body region 32, in other words, the main body region 32b in a region in contact with the gate insulation film 24. The on-potential refers to an electric potential higher than a gate threshold value. Then, electrons flow from the source electrode 70 to the drain electrode 80 via the source region 30, the channel, the drift region 34, and the drain region 35, and the switching device 10 is turned on. When the potential of the gate electrode 26 is lowered to an off-potential, the channel disappears and the flow of electrons stops to turn off the switching device 10. The off-potential refers to an electric potential lower than the gate threshold value.

In the switching device 10, since the source region 30 is not only in contact with the top surface 12a of the semiconductor substrate 12, but is also in contact with the source electrode 70 at the side surface of the trench 22, it is possible to ensure a wider contact surface between the source region 30 and the source electrode 70. For this reason, the contact resistance between the source region 30 and the source electrode is smaller, and the on-resistance of the switching device 10 is smaller.

Figure 4:
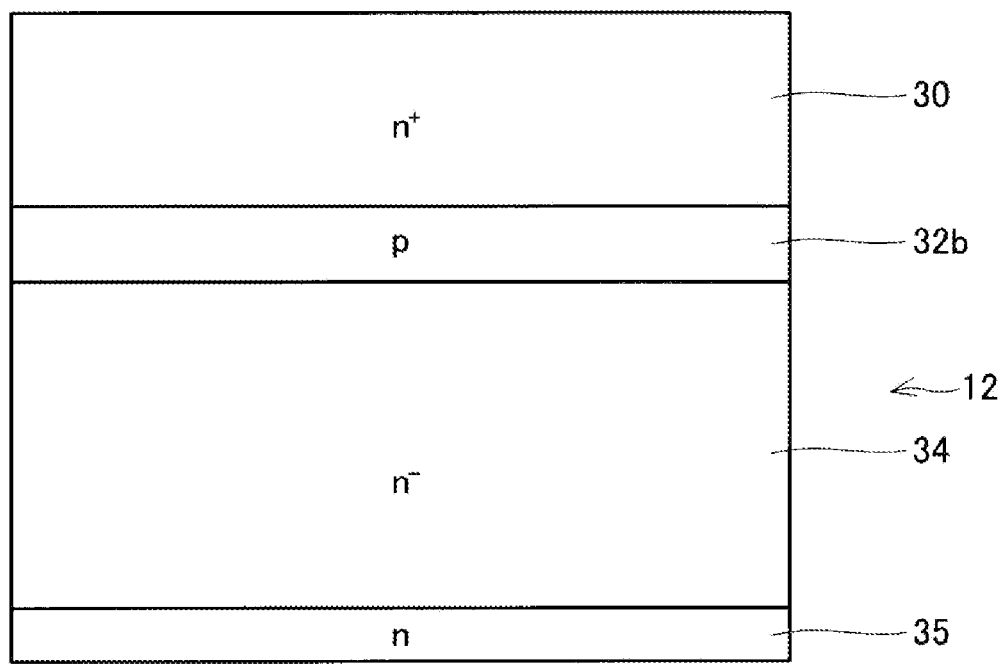
FIG. 4 illustrates a process for manufacturing the switching device according to the first embodiment.

The following describes a method for manufacturing the switching device 10 with reference to FIGS. 4 to 13. Each of FIGS. 4 to 13 illustrates a cross-sectional view corresponding to FIG. 2. The switching device 10 is manufactured from the semiconductor substrate 12, in other words, the semiconductor substrate 12 before processing configured by the drain region 35. As illustrated in FIG. 4, the drift region 34 is epitaxially grown on the drain region 35. Subsequently, the main body region 32b and the source region 30 are formed inside the semiconductor substrate 12. Although not shown, the contact region 32a is formed at a position corresponding to FIG. 3. The contact region 32a, the main body region 32b and the source region 30 can be formed by, for example, epitaxial growth or ion implantation.

Figure 5:
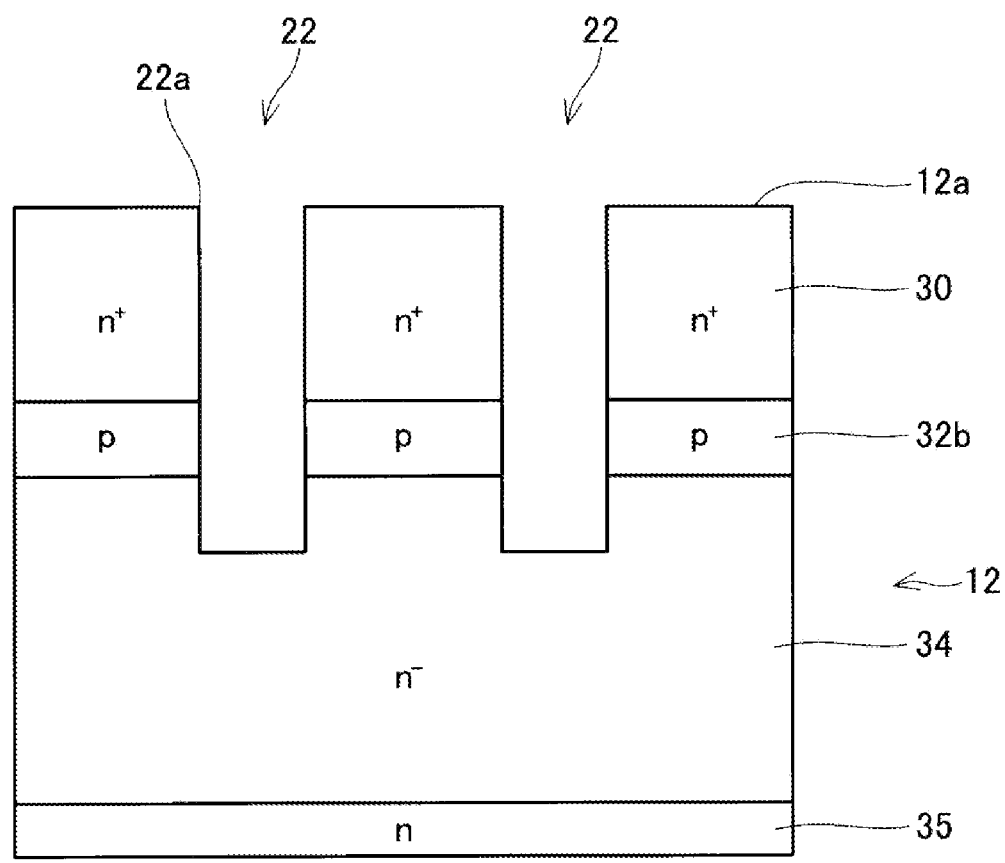
FIG. 5 illustrates a process for manufacturing the switching device according to the first embodiment.

As illustrated in FIG. 5, the trenches 22 are formed by selectively etching the top surface 12a of the semiconductor substrate 12. Each of the trenches 22 are formed such that the trench 22 penetrates the source region 30, the contact region 32a and the main body region 32b and reaches the drift region 34.

Figure 6:
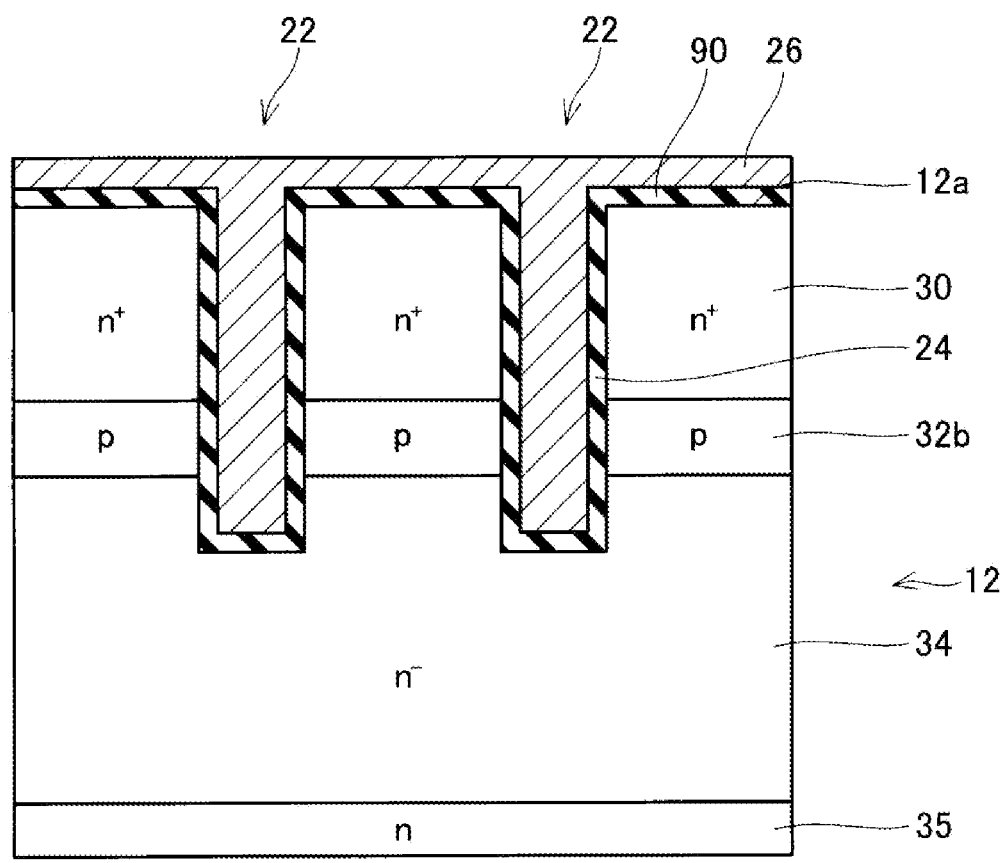
FIG. 6 illustrates a process for manufacturing the switching device according to the first embodiment.

As illustrated in FIG. 6, an insulation layer 90 made of silicon oxide is deposited by using Chemical Vapor Deposition (CVD) technique to cover the top surface 12a of the semiconductor substrate 12 and the inner surface of the trench 22. The insulation layer 90 covering the inner surface of the trench 22 is the gate insulation film 24. Subsequently, the gate electrode 26 is formed by depositing polysilicon at the surface of the insulation layer 90.

Figure 7:
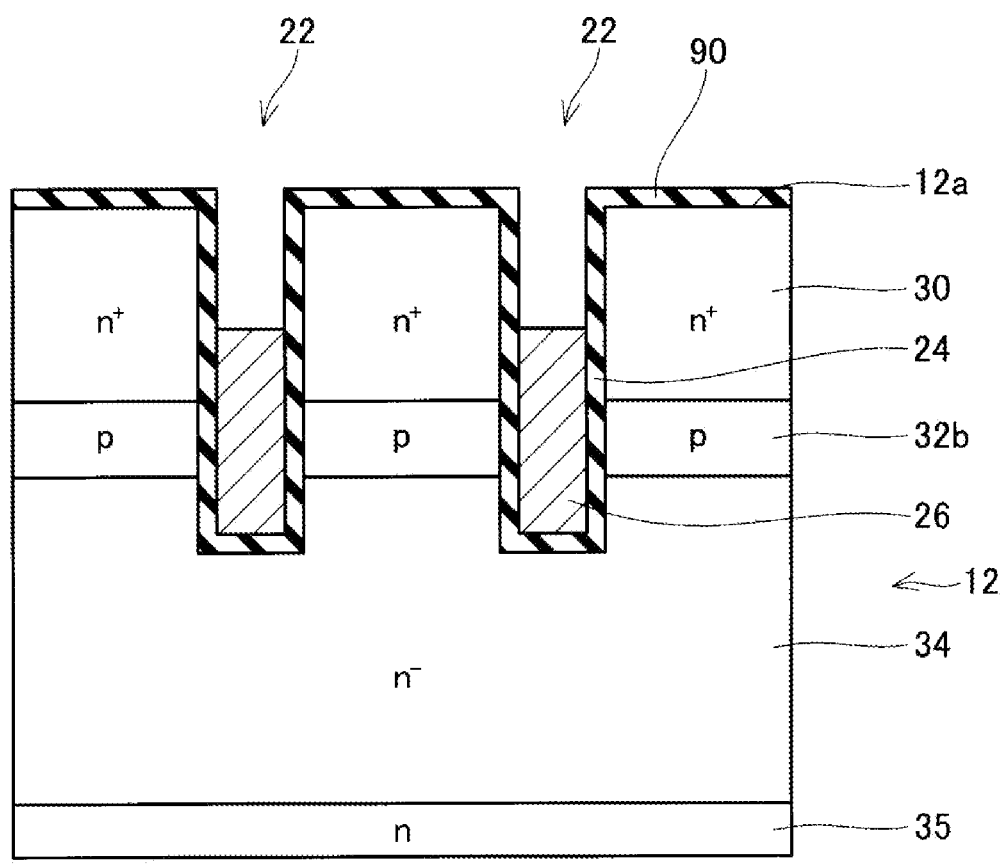
FIG. 7 illustrates a process for manufacturing the switching device according to the first embodiment.

The gate electrode 26 is etched. As a result, as illustrated in FIG. 7, a part of the gate electrode 26 is removed from the upper part of the top surface 12a of the semiconductor substrate 12. The gate electrode 26 is left inside the trench 22. The gate electrode 26 is etched so that the top surface of the remaining gate electrode 26 is located below the top surface 12a of the semiconductor substrate 12. In addition, the gate electrode 26 is etched such that the top surface of the remaining gate electrode 26 is located above the lower end of the source region 30. In a process for oxidizing the top surface of the gate electrode 26 with reference to FIG. 8, the gate electrode 26 is etched to satisfy the mathematical relation of $L>2.7 \times A$, where "L" denotes a distance along the trench 22 between the main body region 32b and an oxide film 40 formed in the process illustrated in FIG. 8, and "A" denotes a diffusion distance of the oxidized species such as oxygen diffusing into the gate insulation film 24.

Figure 8:
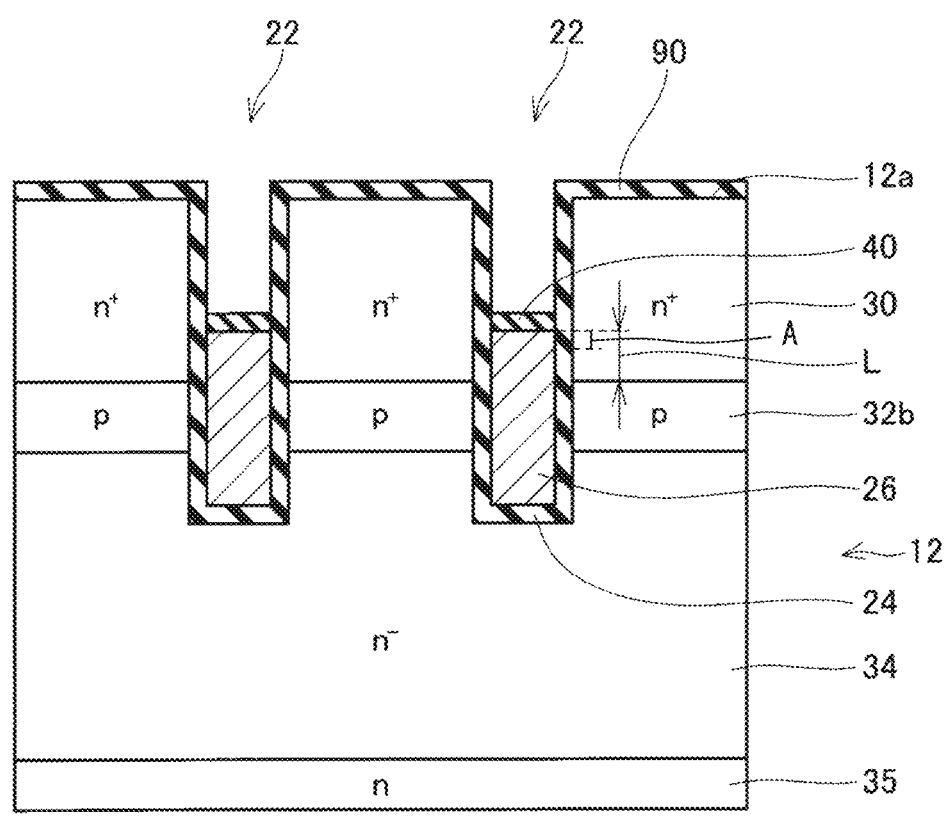
FIG. 8 illustrates a process for manufacturing the switching device according to the first embodiment.

The semiconductor substrate 12 is heated. For example, the semiconductor substrate 12 is subjected to heat treatment at a temperature in a range of 800 to 900 degrees Celsius under an oxygen atmosphere. As a result, the top surface of the gate electrode 26 is oxidized, and the oxide film 40 is formed at the top surface of the gate electrode 26 as illustrated in FIG. 8. Oxidation of the gate electrode 26 proceeds from the top surface of the gate electrode 26 to the interior (lower side) of the gate electrode 26 through the heat treatment. In the present embodiment, the gate insulation film 24 is made of silicon oxide, and A is about 100 nanometers. Therefore, the etching amount, that is, the distance between the etched main body region 32b and the gate electrode 26 is properly designed so that the distance L is longer than about 270 nanometers. In the present embodiment, the heat treatment in the oxygen atmosphere is taken as an example. However, the oxide film 40 may be formed at the surface of the gate electrode by, for example, exposure to oxygen plasma or hydrochloric acid-hydrogen peroxide mixture (HPM) cleaning.

Figure 9:
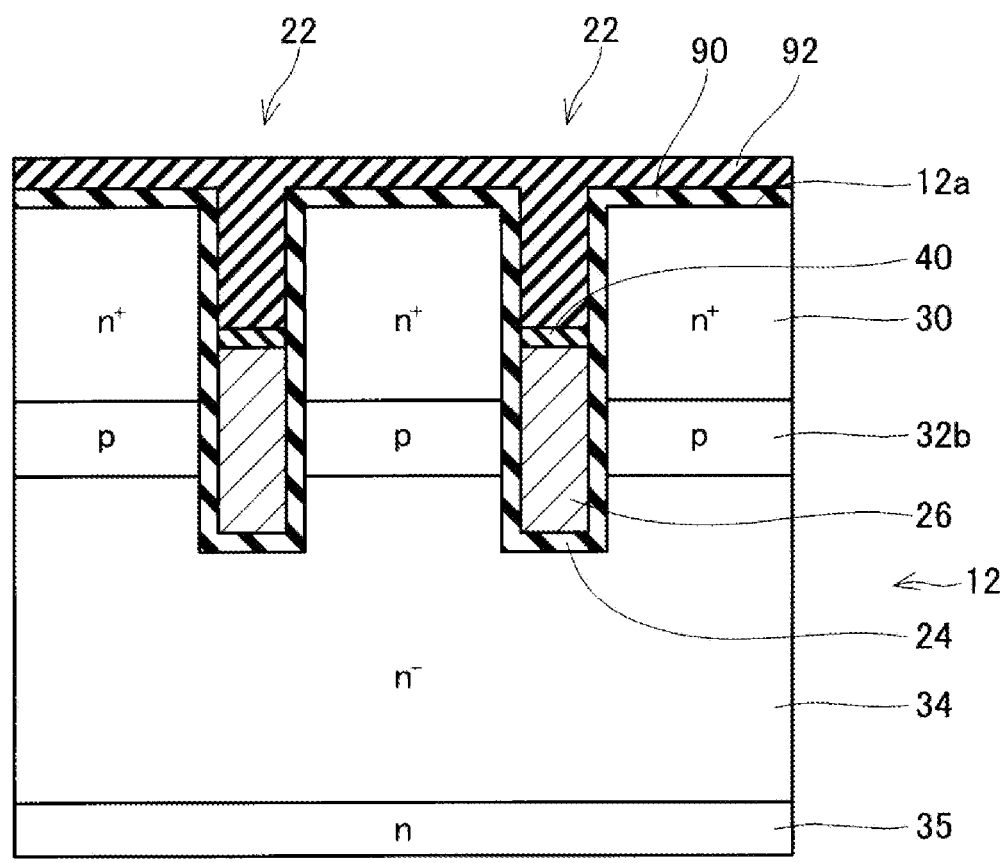
FIG. 9 illustrates a process for manufacturing the switching device according to the first embodiment.
Figure 10:
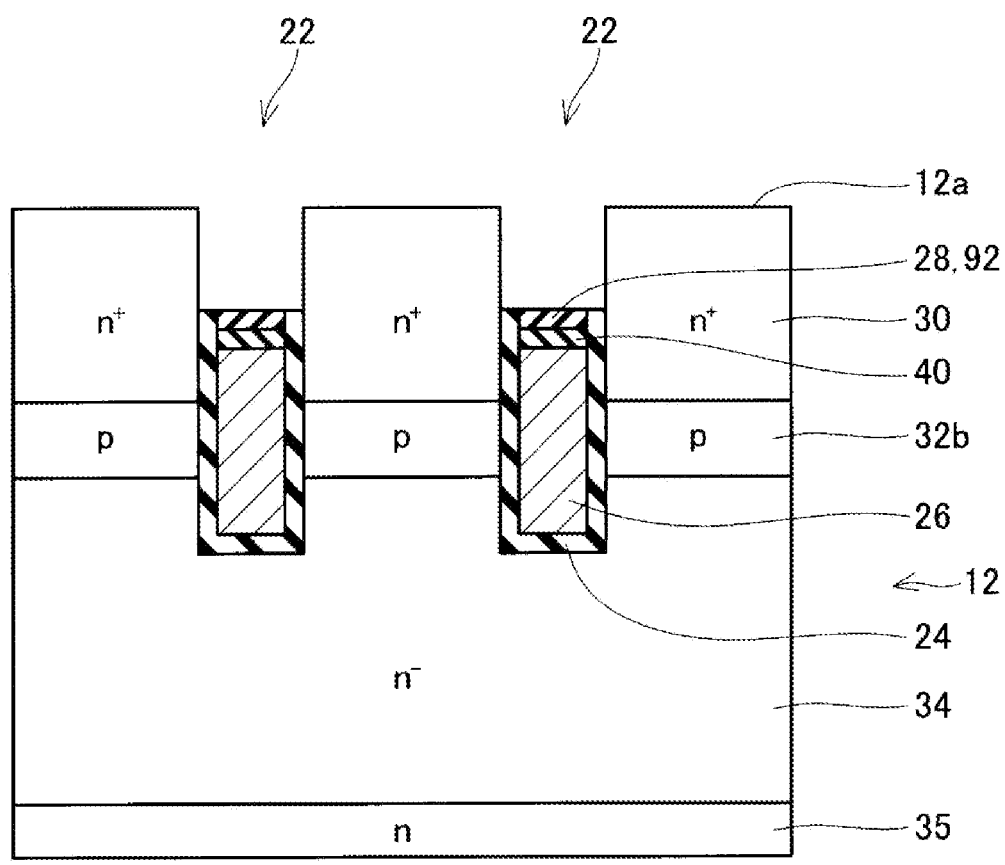
FIG. 10 illustrates a process for manufacturing the switching device according to the first embodiment.

As illustrated in FIG. 9, an insulation layer 92 made of silicon oxide is deposited at the surface of the insulation layer 90 and the top surface of the oxide film 40 by using the CVD technique. The insulation layer 92 is deposited inside the trench 22 and at the upper part of the top surface 12a of the semiconductor substrate 12. In this process, the insulation layer 90 and the insulation layer 92 are integrated.

The insulation layers 90, 92 are etched. The insulation layer 92 is left inside the trench 22. The insulation layer 92 is left such that the insulation layer 92 covers the top surface of the oxide film 40. The insulation layer 92 remained inside the trench 22 is the interlayer insulation film 28. The insulation layer 92 is etched so that the top surface of the interlayer insulation film 28 is located below the top surface 12a of the semiconductor substrate 12.

Figure 11:
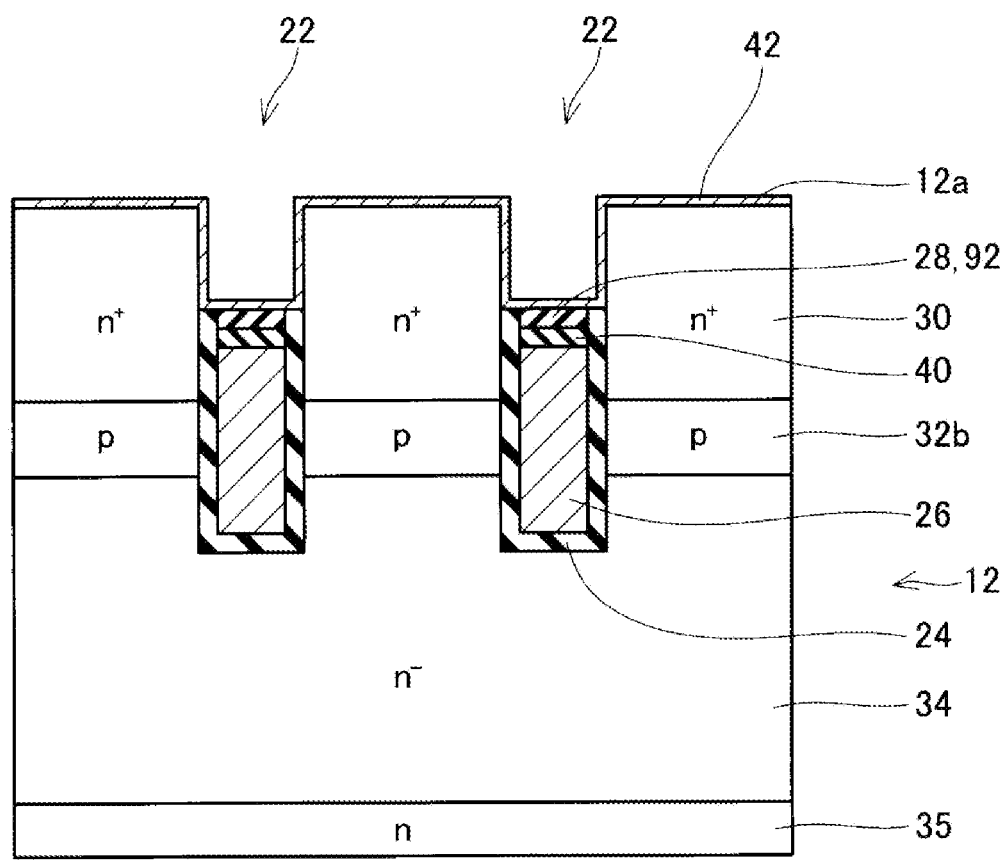
FIG. 11 illustrates a process for manufacturing the switching device according to the first embodiment.

As illustrated in FIG. 11, the nickel layer 42 is deposited at the surface of the semiconductor substrate 12 and the top surface of the interlayer insulation film 28 by, for example, sputtering. The nickel layer 42 is formed to cover the top surface 12a of the semiconductor substrate 12 and the inner surface of the trench 22, in particular, the inner surface of the trench 22 above the top surface of the interlayer insulation film 28.

Figure 12:
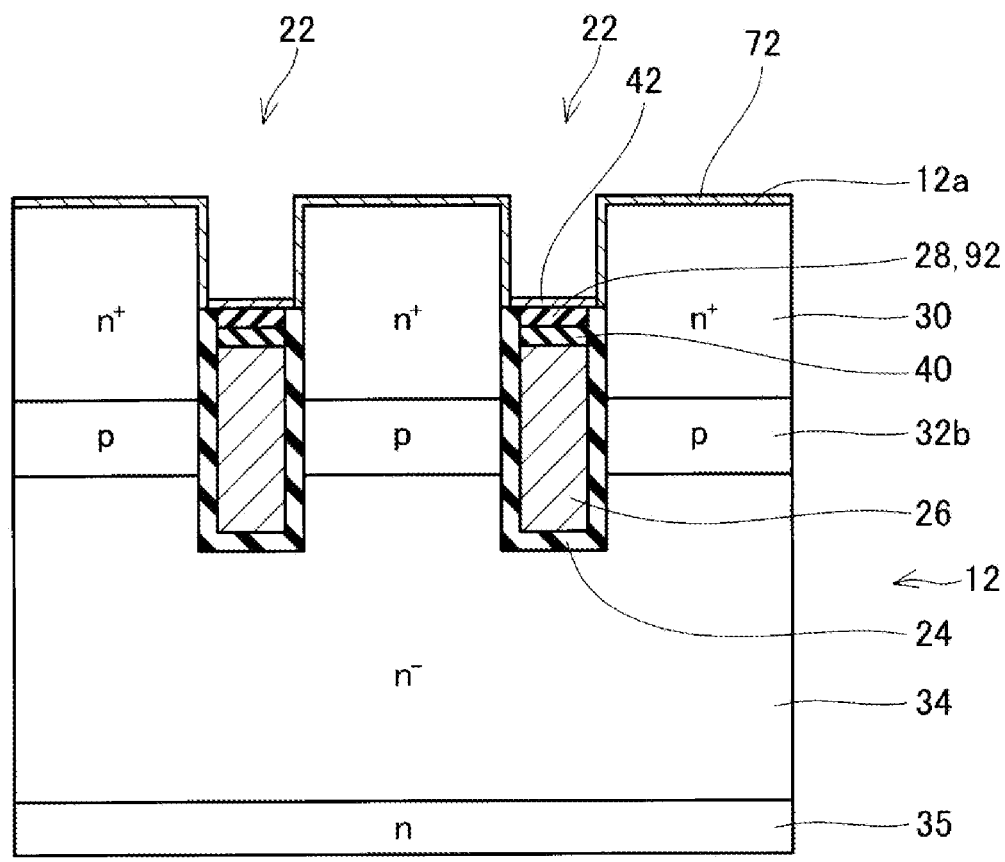
FIG. 12 illustrates a process for manufacturing the switching device according to the first embodiment.

The semiconductor substrate 12 is heated. For example, the semiconductor substrate 12 is subjected to heat treatment at a temperature about 700 degrees Celsius under a nitrogen atmosphere. The nickel in the nickel layer 42 reacts with the silicon in the semiconductor substrate 12. As a result, as illustrated in FIG. 12, the nickel silicide layer 72 is formed in a region where the nickel layer 42 and the semiconductor substrate 12 are in contact with each other. In the region where the nickel layer 42 is not in contact with the semiconductor substrate 12, in other words, the region where the nickel layer 42 is in contact with the interlayer insulation film 28, the nickel layer 42 is not silicided and remains as it is.

Figure 13:
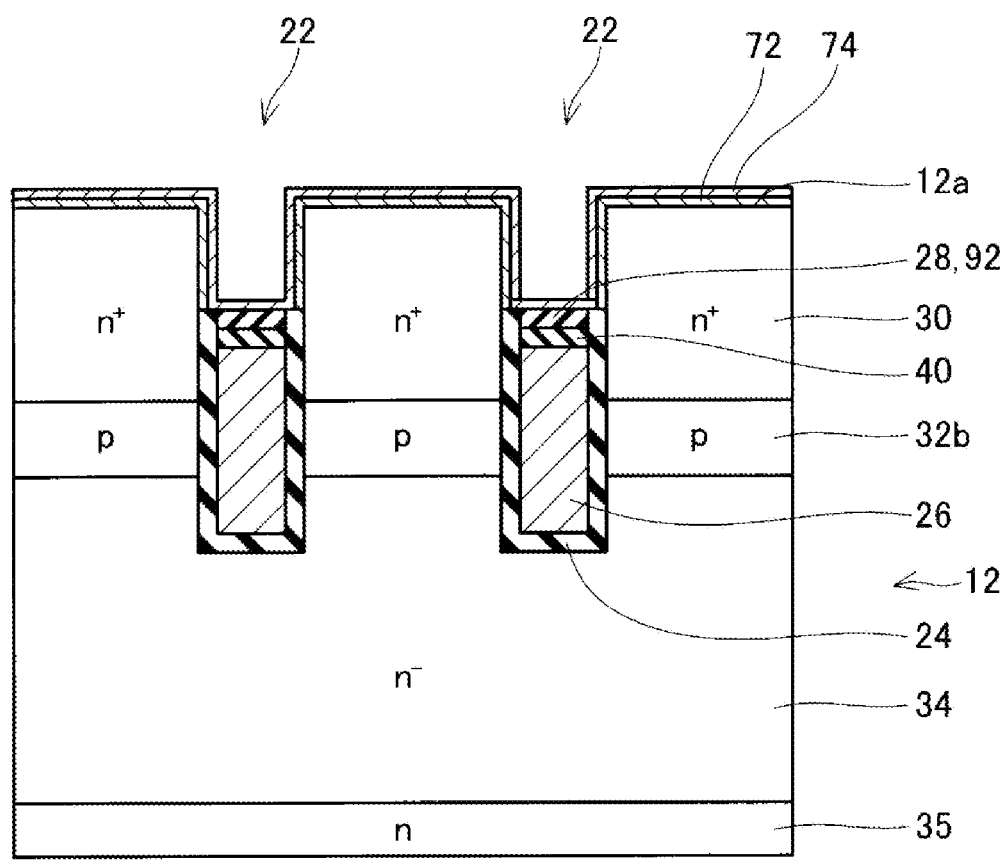
FIG. 13 illustrates a process for manufacturing the switching device according to the first embodiment.
Figure 14:
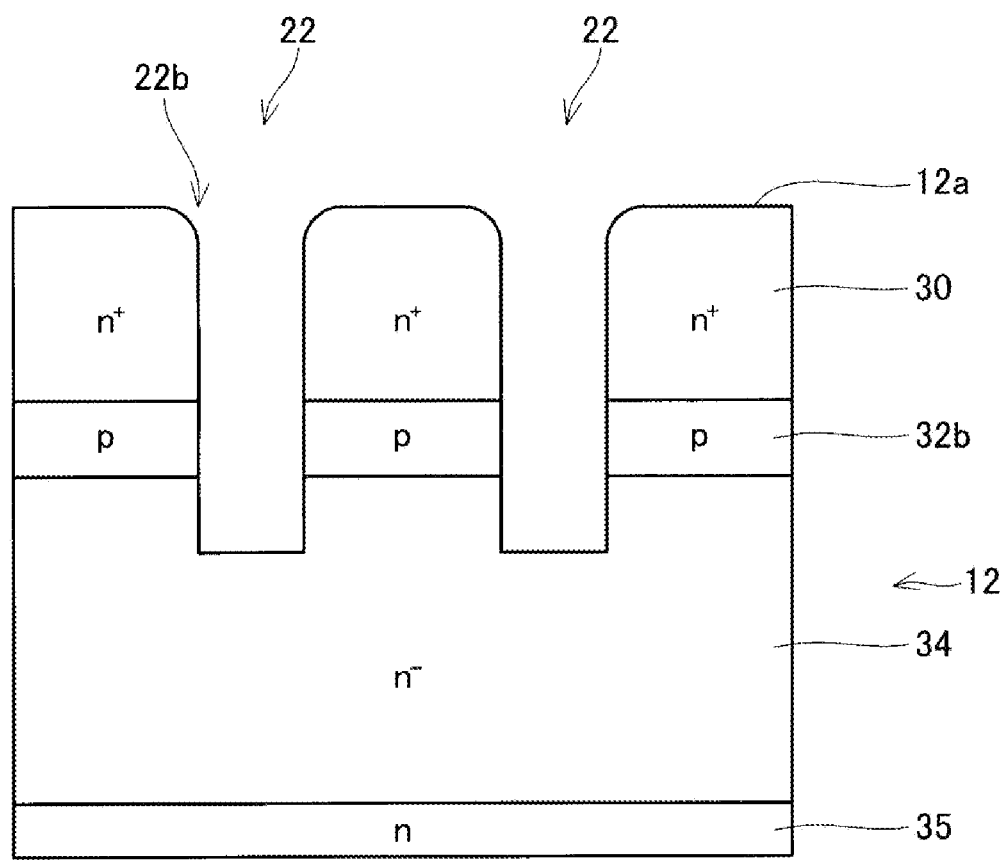
FIG. 14 illustrates a process for manufacturing a switching device according to a second embodiment.

The nickel layer 42 that has not been silicided is removed by etching, and the barrier metal layer 74 is deposited to cover the top surface of the interlayer insulation film 28 and the surface of the nickel silicide layer 72 as illustrated in FIG. 13.

The aluminum layer 76 is deposited at the surface of the barrier metal layer 74 and the drain electrode 80 is formed at the bottom surface 12b of the semiconductor substrate 12 to complete the manufacturing of the switching device 10 as shown in FIGS. 1 to 3.

According to the manufacturing method, it is possible to manufacture the switching device 10 provided with the nickel silicide layer 72 at the side surface of the trench 22 above the interlayer insulation film 28 and the top surface 12a of the semiconductor substrate 12. Accordingly, the source electrode 70 can be brought into contact with the source region 30 and the contact region 32a with lower contact resistance.

According to this manufacturing method, the top surface of the gate electrode 26 is covered by the oxide film 40 and the interlayer insulation film 28. That is, the gate electrode 26 and the source electrode 70 are insulated by a double-layered insulation film. Since the oxide film 40 is formed by thermally oxidizing the gate electrode 26, the content of impurities such as hydrogen is lower than that of the interlayer insulation film 28 formed by vapor phase growth, and the oxide film 40 has higher compactness. Therefore, it is possible to ensure the withstand voltage between the gate and source by the oxide film 40. As a result, it is possible to reduce the film thickness of the interlayer insulation film 28. In the above manufacturing method, it is possible to ensure the withstand voltage of the insulation film for providing insulation between the gate electrode 26 and the source electrode 70 while reducing the entire film thickness of the insulation film. The entire film thickness is the sum of the film thickness of the oxide film 40 and the film thickness of the interlayer insulation film 28. Therefore, it is possible to enlarge the contact area between the source electrode 70 and the side surface of the trench 22 above the interlayer insulation film 28, and it is possible to reduce the contact resistance between the source electrode 70 and the semiconductor substrate 12. Since the film thickness of the entire insulation film is reduced, the degree of freedom in design in the structure in which the insulation film is embedded inside the trench enhances.

In this manufacturing method, the gate electrode 26 is formed to satisfy the mathematical relation of $L > 2.7 \times A$, where "L" denotes the length between the main body region 32b and the oxide film 40 along the trench 22, and "A" denotes the diffusion distance of the oxide species diffusing into the gate insulation film 24 at the time of oxidizing the oxide film 40.

Therefore, it is difficult for the oxidized species such as oxygen in the subsequent heat treatment to reach the body region 32, in other words, the main body region 32b. When the gate electrode 26 is oxidized, the main body region 32b (in other words, the region where the channel is formed) in a range in contact with the gate insulation film 24 is less likely to be oxidized, and the interface between the main body region 32b and the gate insulation film 24 is less likely to be defective. According to the manufacturing method, it is possible to manufacture the switching device 10 having a stable gate threshold value.

Second Embodiment

In a manufacturing method according to a second embodiment, the boundary portion 22a between the side surface of the trench 22 and the top surface 12a of the semiconductor substrate 12 is formed to be a curved surface, after the trench 22 described in the first embodiment is formed as illustrated in FIG. 5. For example, after forming the trench 22, the boundary portion 22a is made to be curved by reactive ion etching (RIE), such that a curved surface portion 22b may be formed to connect the top surface 12a of the semiconductor substrate 12 and the side surface of the trench 22, as illustrated in FIG. 13. For example, the curved surface portion 22b may be formed by processing heat treatment on the semiconductor substrate 12 at the temperature around 1200 degrees Celsius in an argon atmosphere. By forming the curved surface portion 22b as described above, when a metal layer such as the nickel layer 42 or the barrier metal layer 74 is formed from the top surface 12a of the semiconductor substrate 12 over the inner surface of the trench 22, the film forming property of the metal layer enhances, and reliability of the switching device 10 to be manufactured also enhances.

Although the embodiments have been described in detail above, these are merely examples and do not limit the scope of present disclosure. The techniques described in the claims include various modifications and modifications of the specific examples illustrated above. The technical elements described in the present specification or the drawings exhibit technical usefulness alone or in various combinations, and are not limited to the combinations described in the present disclosure at the time of filing. In addition, the techniques illustrated in the present specification or drawings achieve multiple objectives at the same time, and achieving one of the objectives itself has technical usefulness.

What is claimed is:

1. A method for manufacturing a switching device, the method comprising:
    forming a trench at a top surface of a semiconductor substrate;
    forming a gate insulation film for covering an inner surface of the trench;
    forming a gate electrode inside the trench to locate a top surface of the gate electrode below the top surface of the semiconductor substrate;
    forming an oxide film by oxidizing the top surface of the gate electrode;
    forming an interlayer insulation film by vapor phase growth at a top surface of the oxide film to locate a top surface of the interlayer insulation film below the top surface of the semiconductor substrate; and
    forming an upper electrode in contact with the semiconductor substrate at the top surface of the semiconductor substrate and a side surface of the trench located above the top surface of the interlayer insulation film,
    wherein the semiconductor substrate is made of silicon carbide,
    wherein the semiconductor substrate includes
        a drift region of n-type conductivity,
        a body region of p-type conductivity disposed above the drift region, and
        a source region of the n-type conductivity disposed above the body region,
    wherein, in the forming of the trench, the trench is formed to penetrate the source region and the body region and reach the drift region, and
    wherein, in the forming of the oxide film, the top surface of the gate electrode is oxidized to satisfy a mathematical relation of $L>2.7\times A$, where L denotes a distance between the oxide film and the body region along a side surface of the trench, and A denotes a distance of a depth that oxidized species diffuse into the gate insulation film when oxidizing the gate electrode.

2. The method according to claim 1,
wherein, in the forming of the trench, a boundary portion between the side surface of the trench and the top surface of the semiconductor substrate is formed to be curved.

3. The method according to claim 1,
wherein the interlayer insulation film is formed by vapor phase growth of a silane compound at the top surface of the oxide film.

4. The method according to claim 1,
wherein the upper electrode includes:
    a nickel silicide layer that extends from the top surface of the semiconductor substrate to a location inside the trench;
    a barrier metal layer that extends from a location on the nickel silicide layer to a location inside the trench; and
    an aluminum layer that covers a surface of the barrier metal layer.

* * * * *